United States Patent
Loebl

(10) Patent No.: US 8,624,485 B2
(45) Date of Patent: Jan. 7, 2014

(54) ELECTROLUMINESCENT DEVICE

(75) Inventor: Hans-Peter Loebl, Monschau-Imgenbroich (DE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 13/318,799

(22) PCT Filed: Apr. 28, 2010

(86) PCT No.: PCT/IB2010/051845
§ 371 (c)(1),
(2), (4) Date: Nov. 4, 2011

(87) PCT Pub. No.: WO2010/128426
PCT Pub. Date: Nov. 11, 2010

(65) Prior Publication Data
US 2012/0146488 A1    Jun. 14, 2012

(30) Foreign Application Priority Data
May 5, 2009 (EP) .................................... 09159420

(51) Int. Cl.
*H01L 51/50* (2006.01)
*H01L 51/52* (2006.01)

(52) U.S. Cl.
USPC .......................................... 313/504; 313/506

(58) Field of Classification Search
USPC ................................................ 313/498–512
See application file for complete search history.

(56) References Cited

U.S. PATENT DOCUMENTS

| 6,872,472 B2 | 3/2005 | Liao et al. |
| 2005/0233166 A1 | 10/2005 | Ricks et al. |
| 2006/0181203 A1* | 8/2006 | Meng et al. ................. 313/506 |
| 2006/0279203 A1* | 12/2006 | Forrest et al. ............... 313/504 |
| 2007/0131949 A1 | 6/2007 | Liu |
| 2008/0136337 A1 | 6/2008 | Rogojevic et al. |
| 2008/0203903 A1* | 8/2008 | De Kok et al. ............... 313/504 |
| 2008/0278066 A1 | 11/2008 | Spindler et al. |
| 2008/0284317 A1 | 11/2008 | Liao et al. |
| 2008/0284318 A1 | 11/2008 | Deaton et al. |
| 2009/0033212 A1 | 2/2009 | Ahn et al. |

FOREIGN PATENT DOCUMENTS

EP    1670082 A2    6/2006

* cited by examiner

*Primary Examiner* — Karabi Guharay
*Assistant Examiner* — Nathaniel Lee
(74) *Attorney, Agent, or Firm* — David Zivan; Mark L. Beloborodov

(57) ABSTRACT

The present invention provides a color tunable electroluminescent device, such as an OLED device, comprising a substrate, two electrodes, a stack of at least two electroluminescent emission layers (1, 3) comprising electroluminescent molecules that is disposed between said two electrodes and an interlayer (2) disposed between at least two adjacent emission layers. The interlayer furthermore is an undoped interlayer and has a thickness that allows the formation of an interface region comprising electroluminescent molecules present in each of the at least two electroluminescent emission layers. Furthermore, methods of color tuning and producing such an electroluminescent device are provided.

11 Claims, 5 Drawing Sheets

ELECTROLUMINESCENT DEVICE

FIELD OF THE INVENTION

The invention relates to the field of electroluminescent devices, such as OLED devices, comprising a substrate and stacked thereon, two electrodes, a stack of at least two electroluminescent emission layers comprising electroluminescent molecules that is disposed between said two electrodes and an undoped interlayer disposed between each adjacent emission layers. Furthermore, methods of color tuning and producing such an electroluminescent device are provided.

BACKGROUND OF THE INVENTION

Color tunable OLED devices frequently comprise stacked OLED diodes having different emission colors. Such stacked OLEDs contain so-called charge generation layers as transparent electrodes separating the different diodes which are connected to the outside. By applying a voltage to the individual OLED diodes of the stack, the color can be tuned over a wide range.

One disadvantage of such color tuneable stacked OLED devices is that the electrodes have to be highly transparent and should therefore have a low sheet resistance. However, a high transparency and a low sheet resistance are contradictory requirements. Therefore, in most practical cases a compromise between sheet resistance and transparency has to be found which makes large area color tuneable OLEDs difficult to realize. The whole OLED stack is also rather complicated since stacked OLEDs contain typically a large number of layers.

Another technique to realize color tuneable OLEDs is to individually address OLED pixels of different emission color. This is a common technique in displays, which is of course expensive for a light source. If the pixels are made of large size an additional scattering screen is required to get uniform light of one specific color.

SUMMARY OF THE INVENTION

It is an object of the invention to provide a color tunable electroluminescent device and a method of tuning the color of such a device. A further object of the invention is the provision of a method for the production of such a color tunable electroluminescent device.

This object is achieved by an electroluminescent device according to various embodiments of the invention. Particularly, an electroluminescent device is disclosed comprising a substrate, two electrodes, and a stack, the stack comprising at least two electroluminescent emission layers and at least one interlayer disposed between at least two adjacent electroluminescent emission layers, wherein the electroluminescent emission layers comprise electroluminescent molecules, and wherein the interlayer is an undoped interlayer and has a thickness that allows the formation of an interface region comprising electroluminescent molecules present in each of the at least two electroluminescent emission layers separated by the interlayer.

The present invention is based on the unexpected finding that an undoped interlayer of a typical molecular thickness disposed between each two adjacent emission layers of an electroluminescent device is sufficient to provide interface states, or trap states, for electrons and holes by which a transport of electrons and electron holes between the adjacent emission layers can occur. Without being bound to a certain theory it is believed that the provision of these trap states is due to a mixing of the molecules comprised by the adjacent emission layers in the undoped interlayer, whereby an interface layer is formed. If the mobility of the electrons for the transport via the electron trap states is different from the mobility of the holes via the hole trap states then the electric field dependence of electron and hole mobility is not identical. Therefore, application of a variable voltage to the electroluminescent device results in a shift of emission between the emission layers of the stack separated by the undoped interlayer.

The electroluminescent (EL) device can be any EL device known to the skilled person comprising at least two stacked emission layers separated by an interlayer. Preferably the EL device is an organic EL device, i.e. an OLED device. In further embodiments the EL device of the present invention is used as or comprised by a light source, a lamp and/or a day-light lamp, or is comprised by a monitor or television. Thus, also a light source, a lamp, a day-light lamp, a monitor and a television comprising the inventive EL device are encompassed by the present invention.

In the following the basic structure of such an organic EL device is described that comprises two organic light emitting diodes (OLED). However, various other basic structures of EL devices, and particularly organic EL devices, are known to the skilled person, all of which are meant to be encompassed by the present invention.

An exemplary basic organic EL device comprises two electrodes, i.e. an anode and a cathode, wherein the anode is optionally disposed on a substrate such as glass or flexible polyethylene terephtalate (PET) foil. On top of the anode, i.e. the substrate electrode, the following layers are disposed in the order of mention: a hole trans-port layer (HTL), a first electroluminescent layer, i.e. emitter layer (EmL), an interlayer (IL) that acts as a barrier layer, a second emitter layer and an electron transport layer (ETL). The second electrode, i.e. the cathode acting as the counter electrode, is disposed on top of the ETL, followed by an optional cover layer, preferably likewise made of glass or PET. Additional layers may be present, such as a hole injection layer (HIL) disposed between the anode and HTL and/or a electron injection layer (EIL) disposed between ETL and cathode. The HIL is preferably made from poly(3,4-ethylendioxythiophene)/polystyrolsulfonate (PEDOT/PSS), while the EIL is preferably a very thin layer made from lithium fluoride, cesium fluoride or silver.

Further basic exemplary structures of EL devices comprise bottom emission/top emission devices, wherein a transparent or semi-transparent bottom and top electrode, respectively is utilized; transparent LED devices, such as TOLEDS that use a proprietary transparent contact to create displays that can be made to be top-only emitting, bottom-only emitting, or both top and bottom emitting (transparent); inverted EL devices such as inverted OLEDs, in which the anode is placed on the substrate, and further more.

In the context of the present invention an EL device comprising a combination of a transparent substrate, a transparent substrate electrode and a non-transparent counter electrode, i.e. the electrode opposing the substrate which is usually a reflective electrode, emitting the light through the substrate is called "bottom-emitting". In case of an EL device comprising a combination of a non-transparent substrate and/or non-transparent substrate electrode and a transparent counter electrode, emitting light through the counter electrode is called "top-emitting". In preferred embodiments the EL device is bottom-emitting or top-emitting, or comprises two transparent electrodes and emits into both directions.

In one embodiment of the invention, at least one of the electrodes, i.e. the anode and/or the cathode, is transparent or semi-transparent. The term "transparent electrode" is meant to refer to an electrode that shows a transmission of light in the visible range of ≥50%. The remaining light is thus either reflected and/or absorbed. The term "semi-transparent electrode" refers to an electrode that exhibits a transmission of light in the visible range of between ≥10% and <50%. Preferably light in the visible range has a wavelength of between ≥450 nm and ≤700 nm. The electrode may also be reflective, preferably in case of the counter electrode.

In preferred embodiments the electrodes are made from a metal, diamond like carbon, or comprise at least one of the following materials: indium tin oxide (ITO), aluminum, silver, ZnO, doped ZnO or an oxide layer. More preferably, the electrodes are made from a transparent conductive oxide such as ITO, or ZnO. Optionally the electrodes are undercoated with $SiO_2$ and/or SiO to suppress diffusion of mobile atoms or ions from the substrate into the electrode. In a further embodiment thin Ag or Au layers, about 8-15 nm thick—may be used alone or in combination with the electrode layers. If a metal and/or metal foil is used as the electrode it preferably may take the role of the substrate and/or substrate electrode, i.e. either anode and/or cathode. Preferably, the electrodes are connected to a voltage/current source through electrical conductors.

In a further embodiment the EL device is an OLED device, i.e. the electroluminescent emission layers comprise organic molecules. In further preferred embodiments the organic molecules comprise polymers (PLEDs) or small molecules (SMOLEDs). In another preferred embodiment, the EL device is a phosphorescent organic light-emitting diode (PHOLED) device. In a further preferred embodiment, the EL device comprises a combination of phosphorescent and fluorescent emitters (Hybrid OLED). In another preferred embodiment the OLED is a fluorescent light emitting diode.

The present invention is not restricted to specific organic molecules provided such are suitable for the use as electroluminescent molecules in EL devices. Various electroluminescent and/or organic electroluminescent molecules are known to the skilled person, all of which are meant to be encompassed by the present invention. As used in the present invention "electroluminescent molecules" preferably mean "organic electroluminescent molecules". In preferred embodiments the polymers of a PLED are conjugated polymers such as derivates of poly(p-phenylen-vinylene) (PPV), or polyfluorenes and the small molecules of an SMOLED are organo-metallic chelates, such as for example Alq3, Alq2p (BAlq), Ir(ppy)3, Ir(MDQ)2acac, and/or conjugated dendrimers such as a-NPD, TCTA, TBPI, n-MTDATA.

As described above the term "stack" means that at least two electroluminescent emission layers are placed or disposed on top of each other and separated by an interlayer. However, as the EL device of the present invention comprises at least two electroluminescent emission layers, e.g. three, of which at least two adjacent emission layers need to be separated by the undoped interlayer, various stackings may result. In preferred embodiments, the EL device comprises three electroluminescent emission layers of which only two or all three are separated by an interlayer. Most preferably, the EL device of the present invention comprises three electroluminescent emission layers emitting red, green and blue light, respectively. Even more preferably, these three electroluminescent emission layers are stacked in the order of mention, starting from the anode. Still more preferably, only the green and blue emitting electroluminescent emission layers are separated by the interlayer, while the green electroluminescent emission layer is directly stacked on top of the red emission layer. Such an EL device is extremely well suited to produce color shifts along a black body curve.

In a further embodiment of the invention the at least two electroluminescent emission layers have different emission colors. This means that if the EL device of the present invention is induced to emit light by application of electric voltage/current each of the at least two emission layers will emit light at a different wavelength. If n>2 emission layers are present between ≥2 and ≤n−1 emission layers preferably have a different emission color than the other emission layer(s).

Different emission colors are usually achieved by use of different electroluminescent molecules that are comprised by the electroluminescent emission layers. Preferred embodiments for such electroluminescent molecules comprise Ir(MDQ)2acac (Bis(2-Methyldibenzol[F,H]quinoxaline)(Acetylacetonate)-IR-(III)), emitting red; Ir(ppy)3 (Tris-(Phenyl-Pyridil)-IR), emitting green; and SpiroDPVBi (4,4-bis-2,2-diphenylvinyl-1,1-spirobiphenyl), emitting blue light.

In the following, preferred embodiments of the EL device are disclosed which describe the layers deposited onto the substrate in the order of mention. Particularly, the material of the layers and the respective thickness is disclosed and the following abbreviations are used: α-NPD: N,N0-diphenyl-N, N0-bis(1-naphthyl)-1,10-biphenyl-4,40-diamine; Ir(MDQ)2 (acac): Bis(2-Methyldibenzol[F,H]quinoxaline)(Acetylacetonate)-IR-(III); TBPI: 1,3,5-Tris-(1-Phenyl-1H-Benzimidazol-2-YL)-Benzene; TCTA: 4,4',4"-Tris (Carbazol-9-YL)-Triphenylamine; Ir(ppy)3: Tris-(Phenyl-Pyridil)-IR; CBP: 4,4'-Bis(Carbazole-9-YL)-Biphenyl; Spiro-DPVBi: 4,4-bis-2,2-diphenylvinyl-1,1-spirobiphenyl; BAlq: Aluminum (III) bis(2-methyl-8-quinolinate)-4-phenylphenolate.

In a preferred embodiment the EL device comprises the following layers: ITO, 100 nm; α-NPD, 10 nm; α-NPD: 10% Ir (MDQ)2acac, 10 nm; TCTA: 15% Ir(ppy)3, 10 nm; TBPi, 3 nm; SpiroDPVBi, 10 nm; BAlq, 50 nm; LiF, 1 nm; Al, 100 nm.

In another preferred embodiment the EL device comprises the following layers: ITO, 100 nm; α-NPD, 10 nm; α-NPD: 10% Ir (MDQ)2acac, 10 nm; TCTA: 15% Ir(ppy)3, 10 nm; CBP, 3 nm; SpiroDPVBi, 10 nm; BAlq, 50 nm; LiF, 1 nm; Al, 100 nm.

In even another preferred embodiment the EL device comprises the following layers: ITO, 100 nm; p-doped layer, 10 nm; α-NPD, 10 nm; α-NPD: 10% Ir (MDQ)2acac, 10 nm; TCTA: 15% Ir(ppy)3, 10 nm; TBPi, 3 nm; SpiroDPVBi, 10 nm; BAlq, 50 nm; LiF, 1 nm; Al, 100 nm.

In a further preferred embodiment the EL device comprises the following layers: ITO, 100 nm; α-NPD, 10 nm; α-NPD: 10% Ir (MDQ)2acac, 10 nm; TCTA: 15% Ir(ppy)3, 10 nm; TBPi, 3 nm; SpiroDPVBi, 10 nm; Alq3, 50 nm; LiF, 1 nm; Al, 100 nm.

In a further preferred embodiment the electroluminescent emission layers emit complementary or nearly complementary colors, for example yellow and blue, red and green, or red and cyan. More preferably, the emitted colors of the at least two emission layers cover most of the spectrum of the visible light. Even more preferably, three electroluminescent emission layers are present that cover most of the spectrum of the visible light, for example red, green and blue. This has the advantage that a wide range of colors and white light emission can be achieved.

In another embodiment of the invention the color of the device can be tuned always along a line in the CIE chromaticity diagram. Preferably the color is tuned between blue and yellow or between blue an orange so that the resulting colors are close to the black-body line of the CIE diagram. This advantageously allows to shift the color of the device e.g. between 'cold' and 'warm' white.

In a further embodiment of the invention the EL device is color tuneable. By "color tuneable" it is meant that the total spectrum of light or the spectral distribution of light of the EL device, i.e. the light emitted by all of the electroluminescent emission layers present in the EL device, can be changed. For example, if the EL device emits light of the color blue in a first state it may emit light of the color green in a second state. Therefore, the color of light emitted by the EL device has been changed or tuned from blue to green or, in other words, the EL device has been color tuned to now emit green light instead of blue light.

As explained above, due to the thin interlayer the electroluminescent molecules of the two emission layers bordering an intermediate interlayer penetrate the interlayer and form an interface region, wherein both species of the electroluminescent molecules are present. In other words, a mixing of the molecules of the electroluminescent layers occurs. This results in trap states for the electrons and the holes that are created within the interlayer by which transport of electrons and holes occurs. The mobility of electrons within the interlayer is different from the mobility of the holes within the interlayer. Furthermore, the field dependence of the mobility of the electrons is different from the field dependence of the mobility of the holes. In particular, for most electron transporters with a low mobility the electrical field dependence is much stronger than for good hole transporters with high mobility. Therefore, as the field dependence of electron mobility in the interlayer is stronger than that of the hole mobility, a color tuning as a function of a field applied to the EL device is possible.

In a further embodiment the EL device further comprises a power and/or voltage source. Preferably said power and/or voltage source is connected to the electrodes, i.e. anode and cathode, of the EL device. More preferably, the power and/or voltage source provides DC voltage between anode and cathode.

In an even more preferred embodiment the power and/or voltage source is adapted to provide a variable voltage to the EL device, whereby a color tuning of the EL device can be achieved. For example, provided the mobility of the holes is better than the mobility of the electrons, i.e. the holes in the interlayer are transported with a higher speed, then at a first lower voltage only the electroluminescent layer closer to the cathode is emitting light. If subsequently the voltage is increased then the mobility of the electrons if affected more by the increased electrical field than the mobility of the holes, i.e. the increase in speed with which the electrons are transported in the interlayer is stronger compared to the increase in speed with which the holes are transported. Consequently, also the electroluminescent layer closer to the anode starts emitting light.

If the emission color of the electroluminescent layer closer to the cathode is blue and the emission color of the electroluminescent layer closer to the anode is red then, by variation from a lower to a higher voltage, the emitted light of the EL device can be tuned from blue to a mixture of both colors, e.g. white. Furthermore, by applying a higher voltage, also the brightness level of the EL device is varied, i.e. the total amount of light emitted by the device is increased. In a further embodiment a sky blue color can be achieved at a low brightness level and at a lower voltage applied, while a bright warm white color can be achieved at a higher brightness level and a higher voltage applied. Thus, in a preferred embodiment the color can be tuned as function of the applied voltage and the brightness level. Furthermore, color shifts along a black body curve are possible if desired and/or a high efficacy at all brightness levels.

In general all color variations can be realized with the EL device according to the present invention, whereby, preferably, the colors lie on a line in the CIE diagram.

In another preferred embodiment the power and/or voltage source is adapted to provide a pulsed driving scheme to the EL device, wherein a varied voltage is applied to the two or more electroluminescent layers of the EL device. Preferably, the applied voltage is a rectangular voltage. By such means, i.e. the tuning of the emitting intensity of the single electroluminescent layers, a color tuning of the EL device can be achieved at a constant brightness level of the EL device.

A pulsed driving scheme preferably comprises a series of pulses, preferably rectangular, that are applied to the color tunable EL device. Preferably, the frequency is in the kHz range, more preferably between $\geq 100$ Hz and $\leq 3$ kHz. The applied voltage is hereby varied between 0 V at a time interval t2 and a voltage V of preferably $\geq 2$ V and $\leq 20$ V at a time interval t1. The duty cycle is defined as the ratio between t1 divided by t1+t2. A duty cycle of 100% therefore means that the voltage is always on. 50% duty cycle means that the on- and off-times t1 and t2 are equal. Duty cycle of zero means that the device is switched off.

The undoped interlayer poses a barrier for the transport of electrons and holes. In other words, the electron and hole transport across the interlayer is difficult if the energy barriers between the first electroluminescent layer and the interlayer and between the second electroluminescent layer and the interlayer are of a certain magnitude, preferably $\geq 0.4$ eV. If trap states are introduced into the interlayer by the mixing of the electroluminescent molecules comprised in the two electroluminescent layers bordering the interlayer then the transport of electrons and holes can occur a lot easier via these trap states.

The interlayer can be composed of any suitable material that may act as a barrier for the transport of electrons and holes and allows the penetration of the electroluminescent molecules comprised by the bordering electroluminescent layers. In a preferred embodiment, the interlayer comprises a material that results in an energy barrier between the interlayer and a bordering electroluminescent layer of $\geq 0.2$ eV, $\geq 0.3$ eV, $\geq 0.4$ eV, $\geq 0.5$ eV, or $\geq 0.7$ eV. In an even more preferred embodiment the interlayer comprises TBPBi (1,3, 5-Tris-(1-Phenyl-1H-Benzimidazol-2-YL)-Benzene) and/or CBP (4,4'-Bis(Carbazol-9-YL)-Biphenyl).

The thickness of the interlayer needs to be in a range to allow the formation of an interface region comprising electroluminescent molecules present in each of the at least two electroluminescent emission layers. Under such conditions the interlayer is not perfectly closed and the electroluminescent molecules comprised in the adjacent emission layers can form trap states within the interlayer by mixing of said molecules. In other words, the electroluminescent molecules are used to dope the interlayer. In a further embodiment of the invention the interlayer has a thickness of about $\geq 0.5$ nm and about $\leq 30$ nm, $\geq 1$ nm and about $\leq 10$ nm, preferably, about $\geq 1$ nm and about $\leq 8$ nm, about $\geq 5$ nm and about $\leq 8$ nm, or about $\geq 2$ nm and about $\leq 5$ nm and most preferably about $\geq 2$ nm and about $\leq 3$ nm. This has the advantage that trap states in the interlayer by incorporation of electroluminescent molecules from the electroluminescent layers bordering the interlayer can most efficiently be formed. Thus, no production of a doped interlayer is required. Furthermore, it has been shown that while a thickness of the interlayer of about $\geq 5$ nm and about ≤8 nm already provides an outstanding color tuneability, a thickness of the interlayer of about ≥2 nm and about ≤3 nm results in the optimal results. Thus, the tuning range is a function of the thickness of the interlayer, wherein an interlayer of about ≥2 nm and about ≤3 nm results in the widest tuning range.

In a further embodiment the EL device further comprises at least one cover layer deposited on the electrode opposing the substrate. In a preferred embodiment, the different layers of the EL device are deposited on the substrate, starting with the first electrode, and the cover layer is disposed on top of the second electrode, in order to seal and protect the device from, e.g. moisture.

In preferred embodiments the cover layer and/or the substrate is transparent or semi-transparent. The term "transparent" is meant to refer to a substrate and/or cover layer that shows a transmission of light in the visible range of ≥50%. The remaining light is thus either reflected and/or absorbed. The term "semi-transparent" refers to a substrate and/or cover layer that exhibits a transmission of light in the visible range of between ≥10% and <50%. Preferably light in the visible range has a wavelength of between ≥450 nm and ≤700 nm.

In further preferred embodiments the substrate and/or cover layer is made from glass, ceramics, and/or comprises at least one of gold and silver. Further preferred materials for the substrate and/or cover layer comprise polymer sheets or foils, more preferably with a suitable moisture and oxygen barrier to essentially prevent moisture and/or oxygen entering the EL device. In further embodiments non-transparent substrates and/or cover layers such as substrates and/or cover layers made from metal and/or metal foils are utilized. The substrate and/or cover layer may further comprise additional layers, e.g. for optical purposes such as light out-coupling enhancement and the like.

The substrate and/or cover layer can have any suitable geometry, shape or form but is preferably flat and may, if a flexible material is utilized, be shaped or bent into any three-dimensional shape that is required.

In another aspect the invention is directed to a method for tuning the color of an electroluminescent device or the light source, lamp, day-light lamp, monitor or television according to the present invention at varying brightness of the device. Such a color tuning is preferably achieved by changing the voltage that is applied to the electrodes of the EL device, e.g. by means of a voltage source connected to the electrodes, i.e. anode and cathode, of the EL device. As explained in greater detail above, the mobility of the electrons is more dependent on the applied electrical field than the mobility of the holes. Consequently, a change in voltage primarily affects the mobility of the electrons, i.e. the increase in speed with which the electrons are transported in the interlayer.

In a further aspect the invention is directed to a method for tuning the color of an electroluminescent device or the light source, lamp, day-light lamp, monitor or television according to the present invention at constant brightness of the device. Such a color tuning is preferably achieved by application of a pulsed driving scheme to the device.

In even another aspect the invention is directed to a method of producing an electroluminescent device according to the invention comprising the steps of: providing a substrate; and depositing onto the substrate in the order of mention: a first electrode, a stack of at least two electroluminescent emission layers comprising electroluminescent molecules and an interlayer disposed between at least two adjacent emission layers, and a second electrode.

In a preferred embodiment, three electroluminescent emission layers of which only two or all three are separated by an interlayer are deposited as a stack. Even more preferably, three electroluminescent emission layers emitting red, green and blue light, respectively are deposited of which only two or all three are separated by an interlayer are deposited as a stack. Most preferably, only the green and blue emitting electroluminescent emission layers are separated by the interlayer, while the green electroluminescent emission layer is directly stacked on top of the red emission layer.

The electrodes can be deposited by any suitable means. Preferably, the electrodes are deposited using a vacuum processing system for vapor deposition. In further embodiments the vapor deposition is selected from the group consisting of physical vapor deposition (PVD) such as evaporation or sputtering, chemical vapor deposition (CVD), low pressure CVD (LPCVD) or plasma enhanced CVD (PECVD). Preferably, the vapor deposition is LPCVD or PECVD. In further preferred embodiments the vapor deposition is a deposition of metal oxide, more preferably a deposition of ZnO or indium tin oxide (ITO). ITO or ZnO layers show premium performance. Most preferably the vapor deposition is a ZnO or ITO LPCVD, or a ZnO or ITO PECVD, or a ZnO or ITO sputtering process.

Various methods for the deposition of the electroluminescent layers are known to the skilled person all of which are meant to be encompassed by the present invention. Electroluminescent layers based on small molecules are preferably disposed by PVD, OVPD. Preferred deposition techniques which can be used for small molecule OLEDs include vacuum thermal evaporation (VTE) of organic materials from a crucible, and/or organic vapor phase deposition (OVPD) where the organic material is trans-ported to the substrate by means of a gas flow. These techniques allow the precise control of the interlayer thickness. Especially OVPD technique is very allows an excellent thickness control and allows in addition to control the film morphology of the interlayer. In further preferred embodiments electroluminescent layers based on polymers, i.e. molecules of greater length, are first solubilized in suitable solvents and a subsequently deposited by printing or spin-coating methods.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
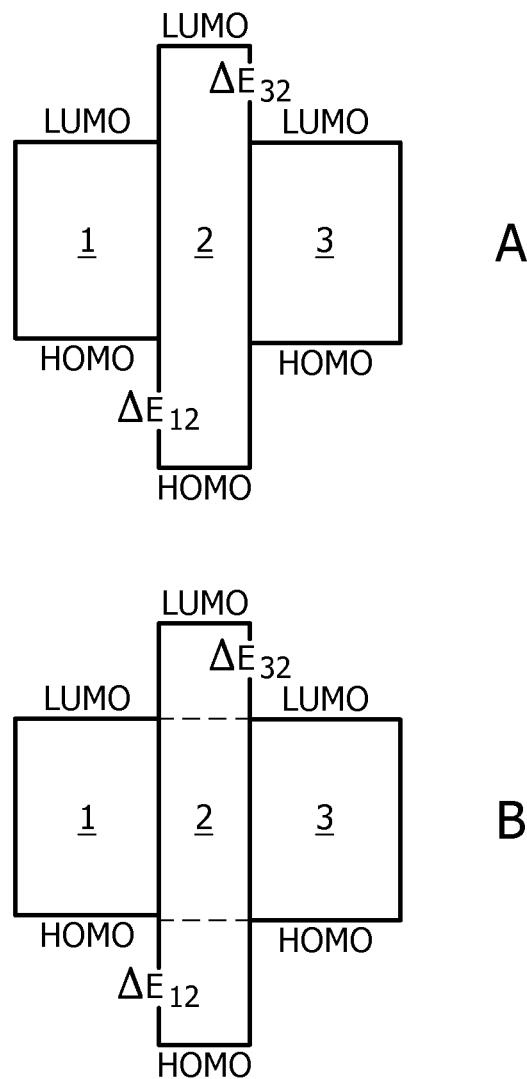
FIG. 1 shows a schematic view of an energy diagram of an electroluminescent device comprising an interlayer.

FIG. 1 shows an energy diagram of an electroluminescent device comprising an interlayer 2 and two electroluminescent emission layers 1, 3 emitting different colors. The anode (not shown) is positioned to the left of emission layer 1, the cathode (not shown) is positioned to the right of emission layer 3.

The undoped interlayer 2 acts as a barrier layer and—per se—makes a transport of electrons and holes via the barrier difficult. As can be seen in FIG. 1A the energy barrier between a transport between emission layer 1 and interlayer 2 ($\Delta E_{12}$), and emission layer 3 and interlayer 2 ($\Delta E_{32}$) is quite high and typically ranges within the order of at least 0.4 eV.

The undoped interlayer 2 in FIG. 1B according to the present invention is of a thickness that allows the formation of an interface region comprising electroluminescent molecules present in each of the at least two electroluminescent emission layers 1, 3 separated by the interlayer. This way, trap states are introduced into the interlayer (designated by the dashed lines) facilitating an easier transport of electrons and holes in the interlayer via these trap states.

As the electroluminescent molecules present in the interlayer originate from the two emission layers bordering the interlayer, the LUMO and HOMO levels of the two emission layers adjacent to the interlayer are aligned with the energy levels of the additional trap levels in the interlayer. Therefore, the transport of electrons and holes is significantly improved.

Figure 2:
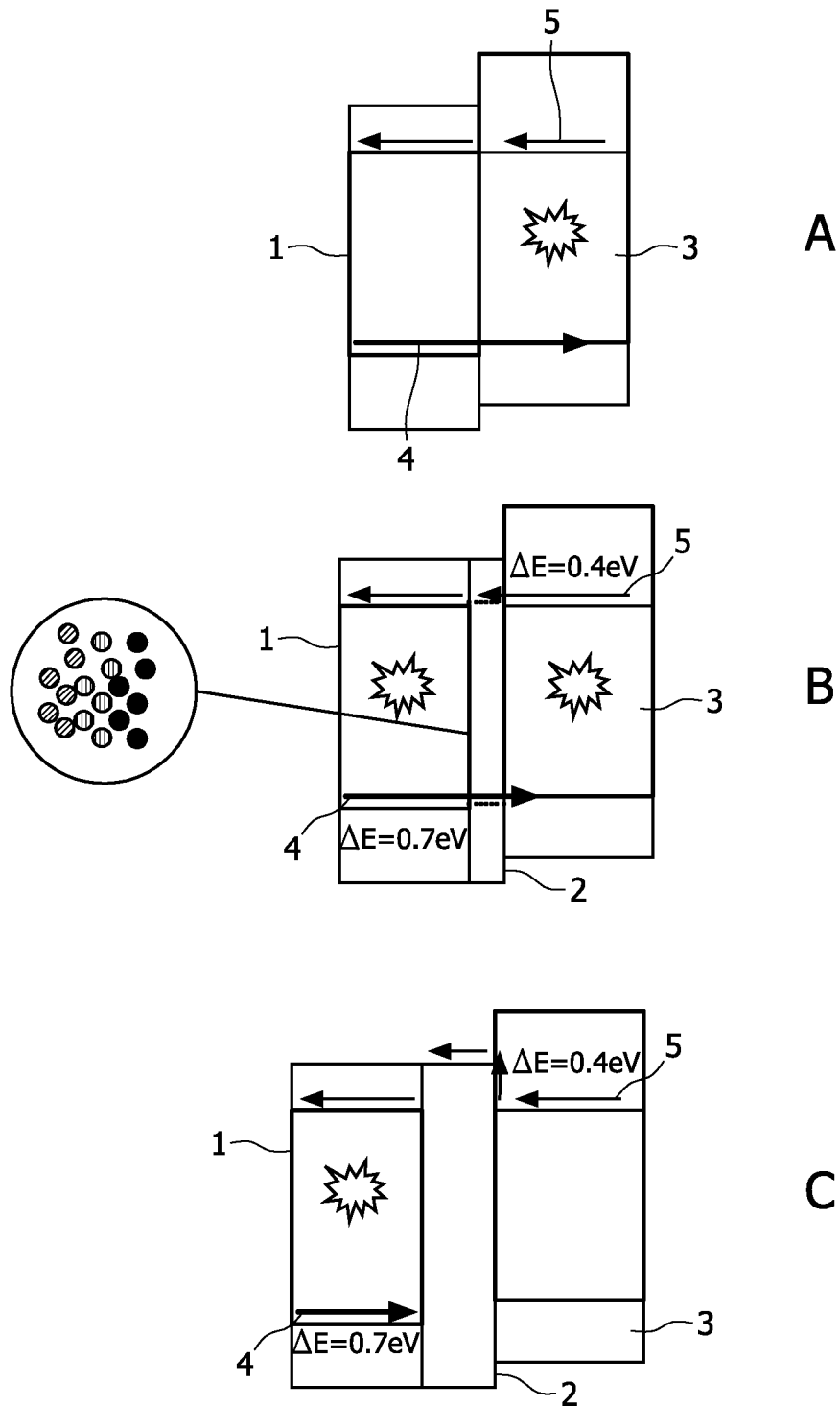
FIG. 2 shows a schematic view of an energy diagram of an OLED device with varying thickness of the interlayer.

FIG. 2 shows an energy diagram of an OLED device with varying thickness of the interlayer. An OLED device with two electroluminescent emission layers 1, 3 is shown, wherein emission layer 1 emits orange light and emission layer 3 emits light of the complementary color blue.

In FIG. 2A, no interlayer 2 and thus no level alignment is present. Since the mobility of holes (depicted by arrow 4) is better than mobility of electrons of electrons (depicted by arrows 5) the emission zone is in the emission layer 3 on the right hand side. Consequently, without an interlayer, only emission layer 3 will emit light, i.e. blue light in the present case. Therefore, the charge balance and thus the position of the recombination zones can be tuned as a function of the applied voltage.

FIG. 2B shows an energy diagram of an OLED device according to the present invention, wherein the undoped interlayer 2 is of a thickness of about ≥2 nm and about ≤3 nm that allows the formation of an interface region comprising electroluminescent molecules present in each of the at least two electroluminescent emission layers 1, 3 separated by the interlayer. Thus, trap states are produced within the interlayer 2 by doping of the electroluminescent molecules of the adjacent emission layers 1, 3 into the thin interlayer. Transport of electrons and holes occurs via trap states introduced into the interlayer. Since electron mobility in the interlayer is stronger field dependent than hole mobility, a color tuning as function of the applied field is possible, for example a change from 3.3 V to 4.5 V. In this case the color of the light of the OLED device will be tuned from a bluish color to white.

FIG. 2C shows an energy diagram of an OLED device, wherein the undoped interlayer 2 is of a thickness of about 10 nm and poses a barrier for the transport of holes. Consequently, emission only takes place in emission layer 1, i.e. orange light is emitted by the OLED device.

Figure 3:
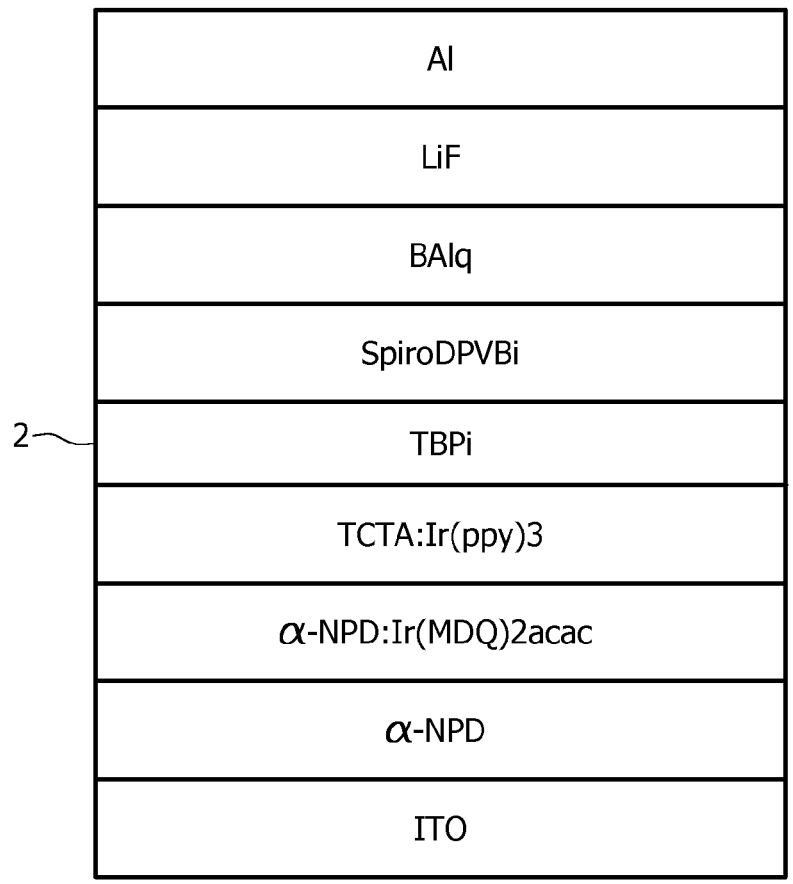
FIG. 3 shows a schematic view of the stack of an OLED device according to the invention.

FIG. 3 schematically shows a stack of an OLED device according to the invention, wherein three electroluminescent emission layers are present, emitting light of the colors red, green and blue, and wherein an interlayer 2 is deposited between the green and the blue emitting layers. The stack comprises 9 layers, starting with an ITO anode with a thickness of about 100 nm (bottom) that has been deposited on a substrate (not shown) using a CVD technique. Stacked onto the ITO anode, the following layers are visible: an α-NPD layer with a thickness of about 10 nm, an α-NPD: 10% Ir(MDQ)2acac layer with a thickness of about 10 nm, an TCTA: 15% Ir(ppy)3 layer with a thickness of about 10 nm, a TBPi interlayer 2 with a thickness of about 3 nm, a SpiroD-PVBi layer with a thickness of about 10 nm, a BAlq layer with a thickness of about 50 nm, a LiF layer with a thickness of about 1 nm, and an Al layer with a thickness of about 100 nm.

Figure 4:
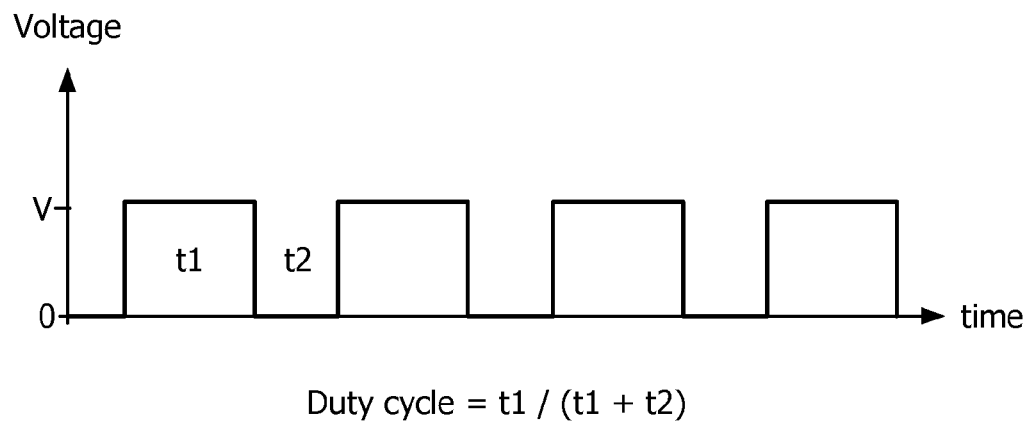
FIG. 4 shows a pulsed driving scheme for an OLED device according to the invention.

FIG. 4 shows a pulsed driving scheme for an OLED device according to the invention, wherein a series of rectangular pulses is applied to the color tunable OLED device. The frequency is set to about 1 kHz. The applied voltage is varied between 0 V at t2 and about 10 V at t1. The duty cycle in this example is about 60%.

Figure 5:
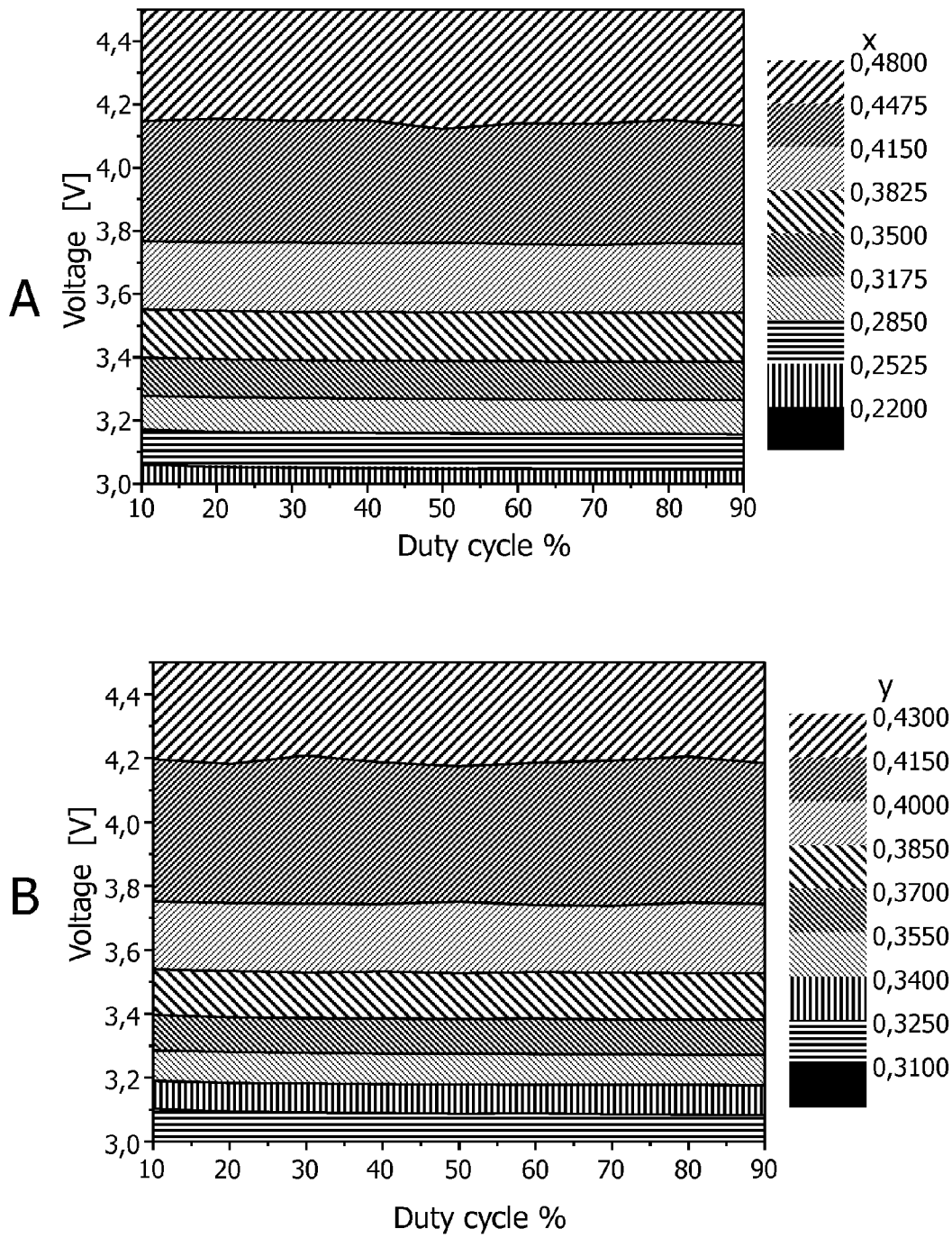
FIG. 5 shows CIE1931 color coordinates x and y of a color tunable OLED device according to the invention, depending on the driving voltage.

FIG. 5 shows CIE1931 color coordinates x and y of a color tunable OLED device according to the invention, depending on the driving voltage.

FIG. 5A shows the CIE1931 x-coordinate as function of duty cycle and voltage of the color tunable OLED with an interlayer thickness of 3 nm. The color is independent of the duty cycle which means that color and brightness can be controlled independently.

FIG. 5B shows the CIE1931 y-coordinate as function of duty cycle and voltage of the color tunable OLED. Again, the color is independent of the duty cycle which means that color and brightness can be controlled independently.

Figure 6:
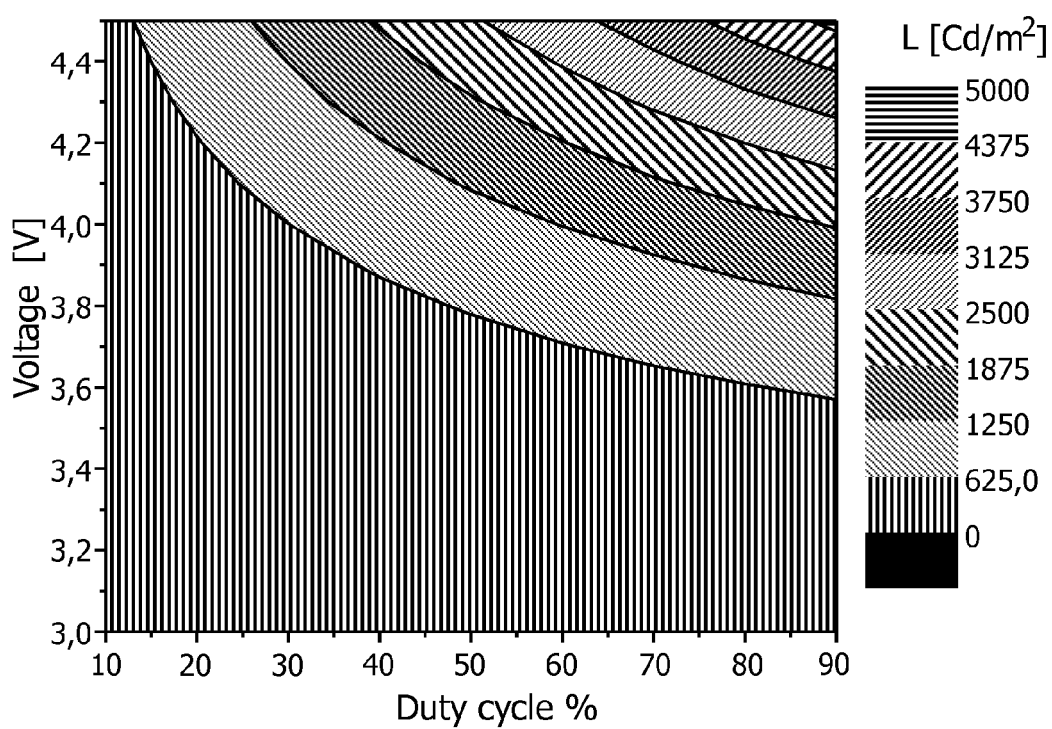
FIG. 6 shows the luminance of a color tunable OLED according to the invention as a function of duty cycle and voltage.

In summary, it is evident that that the x and y CIE1931 color coordinates of the OLED device according to the invention are independent of the duty cycle and depend only on the driving voltage (V). Therefore color and luminance of the color tunable device can be controlled independently. Furthermore, the current and power efficiency, respectively of an OLED device according to the present invention, with an interlayer thickness of 3 nm is extremely good at low and high brightness levels FIG. 6 shows the luminance of a color tunable OLED according to the invention as a function of duty cycle and voltage. As can be seen, it is easily possible to vary the voltage between 3.6 and 4.5 V and to keep the luminance at about 1000 Cd/m$^2$ constant by varying the duty cycle between 90% and 10%. Thus an operation of the inventive EL device at constant luminance with different emission color is possible.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An electroluminescent device comprising:
   a substrate;
   two electrodes;
   a stack disposed between the electrodes that comprises at least two electroluminescent emission layers and at least one interlayer disposed between at least two adjacent layers of the electroluminescent emission layers, wherein each of the electroluminescent emission layers comprise electroluminescent molecules, and wherein the interlayer includes an interface region comprising a mixture of portions of the electroluminescent molecules from each of the at least two adjacent layers separated by the interlayer such that light emission from a first layer of the at least two adjacent layers exhibits a dependence on a voltage applied between the electrodes that is greater than a dependence on the voltage exhibited by light emission from a second layer of the at least two adjacent layers; and a voltage source adapted to vary the voltage applied between the electrodes and thereby tune the light emission from the first layer.

2. The electroluminescent device according to claim 1, wherein at least one of the electrodes is transparent or semi-transparent.

3. The electroluminescent device according to claim 1, wherein the electroluminescent device is an OLED device comprising at least two electroluminescent emission layers comprising organic electroluminescent molecules.

4. The electroluminescent device according to claim 1, wherein the electroluminescent emission layers have different emission colors.

5. The electroluminescent according to claim 4, wherein the emission colors are complementary colors.

6. The electroluminescent device according to claim 1, wherein the electroluminescent device is color tuneable at a constant or a varying brightness level.

7. The electroluminescent device according to claim 1, further comprising a power and/or voltage source connected to the electrodes and adapted to provide a variable voltage and/or a pulsed driving scheme to the EL device.

8. The electroluminescent device according to claim 1, wherein the undoped interlayer has a thickness of between $\geq 0.5$ nm and $\leq 30$ nm.

9. The electroluminescent device according to claim 1, wherein the substrate is selected from the group consisting of a transparent or semi-transparent substrate, a glass substrate, a flexible substrate and/or a polymer substrate.

10. The electroluminescent device according to claim 1, wherein the device is configured to emit a composite light comprising the light emission from the first layer and the light emission from the second layer and wherein the variation of the voltage implemented by the voltage source varies both a proportion of the composite light contributed by the light emission from the first layer and a proportion of the composite light contributed by the light emission from the second layer.

11. The electroluminescent device according to claim 10, the light emission from the first layer has a color that is different than a color of the light emission from the second layer and wherein the variation of the voltage implemented by the voltage source tunes the color of the composite light.

* * * * *